United States Patent
Ollier et al.

(10) Patent No.: US 8,183,078 B2
(45) Date of Patent: May 22, 2012

(54) DEVICE WITH INTEGRATED CIRCUIT AND ENCAPSULATED N/MEMS AND METHOD FOR PRODUCTION

(75) Inventors: Eric Ollier, Grenoble (FR); Thomas Baron, Grenoble (FR)

(73) Assignees: Commissariat a l'Energie Atomique et aux Energies Alternatives, Paris (FR); STMicroelectronics (Crolles 2) SAS, Crolles (FR)

( * ) Notice: Subject to any disclaimer, the term of this patent is extended or adjusted under 35 U.S.C. 154(b) by 131 days.

(21) Appl. No.: 12/744,827

(22) PCT Filed: Dec. 3, 2008

(86) PCT No.: PCT/EP2008/066733
§ 371 (c)(1),
(2), (4) Date: May 28, 2010

(87) PCT Pub. No.: WO2009/071595
PCT Pub. Date: Jun. 11, 2009

(65) Prior Publication Data
US 2010/0314668 A1    Dec. 16, 2010

(30) Foreign Application Priority Data
Dec. 4, 2007   (FR) ...................... 07 59541

(51) Int. Cl.
*H01L 21/00*   (2006.01)
(52) U.S. Cl. .......................... 438/52; 438/53
(58) Field of Classification Search .............. 438/48–53; 257/E21.4, E29.324
See application file for complete search history.

(56) References Cited

U.S. PATENT DOCUMENTS

| | | | |
|---|---|---|---|
| 6,531,331 B1 | 3/2003 | Bennett et al. | |
| 7,642,114 B2 * | 1/2010 | Yamaguchi et al. | 438/50 |
| 8,030,651 B2 * | 10/2011 | Yamaguchi et al. | 257/53 |
| 8,093,087 B2 * | 1/2012 | Hsieh et al. | 438/51 |
| 2003/0049878 A1 | 3/2003 | Offenberg et al. | |
| 2006/0205106 A1 | 9/2006 | Fukuda et al. | |
| 2009/0321793 A1 | 12/2009 | Ollier et al. | |
| 2010/0258882 A1 * | 10/2010 | Magnee et al. | 438/50 |
| 2010/0270596 A1 * | 10/2010 | Takagi et al. | 438/52 |
| 2011/0068374 A1 * | 3/2011 | Tan et al. | 438/50 |

FOREIGN PATENT DOCUMENTS
WO        01 77008      10/2001

OTHER PUBLICATIONS

Ollier, E. et al., "NEMS Devices for Accelerometers Compatible with Thin SOI Technology", IEEE-NEMS 07, Total pp. 4 ( 2007).
Ghosh, S. et al., "On Integrated CMOS-MEMS System-on-Chip", Total pp. 6 (2005).

* cited by examiner

Primary Examiner — Cuong Q Nguyen
(74) Attorney, Agent, or Firm — Oblon, Spivak, McClelland, Maier & Neustadt, L.L.P.

(57) ABSTRACT

A method for producing a device including at least one integrated circuit and at least one N/MEMS. The method produces the N/MEMS in at least one upper layer arranged at least above a first section of a substrate, produces the integrated circuit in a second section of the substrate and/or in a semiconductor layer arranged at least above the second section of the substrate, and further produces a cover encapsulating the N/MEMS from at least one layer used for production of a gate in the integrated circuit and/or for producing at least one electrical contact of the integrated circuit.

31 Claims, 7 Drawing Sheets

DEVICE WITH INTEGRATED CIRCUIT AND ENCAPSULATED N/MEMS AND METHOD FOR PRODUCTION

TECHNICAL FIELD

The invention relates to the field of MEMS (micro electro mechanical systems) and/or NEMS (nano electro mechanical systems), intended to be co-integrated, in other words formed on a same substrate, with integrated circuits, for example of MOS or CMOS type. The invention finds in particular applications for the production of sensors of any type, for example inertial (accelerometers, gyrometers), chemical, resonating or not, or resonators of, for example, electro-mechanical type used in RF applications (time reference, filters, VCO), for example in the field of mobile telephony.

The term N/MEMS (nano/micro electro mechanical system) is used in the remainder of this document to designate a MEMS or NEMS type device.

STATE OF THE PRIOR ART

The hybrid approach, in other words the separate production of a N/MEMS and an integrated circuit such as an ASIC (application specific integrated circuit) then their assembly on a device, makes it possible to develop and optimise separately the N/MEMS and the integrated circuit, ensuring short development times for each of them. Nevertheless, the performances of such a device may be limited by the parasite capacities stemming from the connections made to connect the N/MEMS and the integrated circuit, due in particular to the size of the connection pads and to the length of the necessary connection wires. In addition, the size induced by the transfer of one of the two components onto the other also constitutes a drawback. Finally, in this approach, additional costs for the encapsulation (packaging) and the transfer are added to the manufacturing costs of the two separate components.

Compared to the hybrid approach, the co-integration, in other words the integration on the same chip of N/MEMS structures and associated electronic circuits, makes it possible to reduce the sizes of the connections made, to simplify the encapsulation and the assembly, and to enhance the performances of the complete system.

There exist several types of approach to achieve a co-integration of N/MEMS with one or more integrated circuits, for example of CMOS type, on a same substrate:
- the "pre-CMOS" approach: the structure of the N/MEMS is defined on the substrate before the production of the CMOS device,
- the "intermediate-CMOS" approach: the steps of production of the CMOS device (Front-End or Back-end, in other words all of the steps of the CMOS production method implemented respectively before or after the deposition of the metallisations forming the contacts of the CMOS device) are interrupted to implement the steps of production of the N/MEMS,
- the "post-CMOS" approach: the structure of the N/MEMS is defined after the production of the CMOS device.

In the "post-CMOS" approach, the fact that the structure of the N/MEMS is defined after the production of the CMOS device imposes considerable constraints on the possible choices of the materials and steps implemented for the production of the N/MEMS due to the thermal budget constraints imposed so as not to deteriorate the CMOS device.

The "intermediate-CMOS" approach leads to an integration of the N/MEMS. Compared to the "post-CMOS" and "pre-CMOS" approaches, it is possible to produce the N/MEMS as close as possible to the CMOS circuit by using the steps implemented for the production of the CMOS, which makes it possible to optimise as best as possible the overall production of the system by reducing the costs for large productions, but also to benefit from new developments in the field of N/MEMS. In this approach, the N/MEMS may be formed either in the "Back-End" part, in other words at the level of interconnection layers of the CMOS device, or in the "Front-End" part, in other words at the level of the transistors of the CMOS device. One then speaks of "In-IC" integration, or in the integrated circuit.

In these different approaches, it is possible to carry out an encapsulation of the N/MEMS, for example to arrange the N/MEMS in a particular medium (vacuum, gas or liquid) and thereby improve the performances of the N/MEMS (for example its quality factor when the N/MEMS is a resonating structure) and its reliability (for example by ensuring a protection in relation to contaminants such as water, organic compounds, etc.), or by transfer of an additional substrate onto the device, for example by a step of sealing by means of a resin, an anodic sealing, a eutectic sealing, etc., or by using an additional added thin film.

Document US 2006/0205106 A1 describes an example of "intermediate-CMOS" approach in which the steps of production of the metallic interconnection levels of the integrated circuit ("Back-End" of the CMOS) are also implemented for the production and the encapsulation of a N/MEMS. This involves what is known as a "vertical" integration, the N/MEMS being formed "above" the CMOS, in other words at a level above the CMOS, after the production of the "Front-End" part of the CMOS.

However, in this integration example, the choice of the materials forming the mechanical structure of the N/MEMS is restricted since this mechanical structure is necessarily formed from one or more layers of metallic material forming the interconnection levels of the CMOS. The sacrificial layers under and on the mechanical structure of the N/MEMS are formed by the dielectric layers arranged between the metallic interconnections. This method thus does not enable the use of semiconductor, for example monocrystalline silicon, the mechanical properties of which are interesting, for the production of the N/MEMS. In addition, the use of metals for the interconnection layers for the production of the N/MEMS poses problems for the design and the reliability of the N/MEMS on account of the residual stresses and high coefficients of thermal expansion of said metals.

Document U.S. Pat. No. 6,531,331 B1 describes another example of "intermediate-CMOS" approach employing a "horizontal" integration of an N/MEMS during the Front-End CMOS method. The technological steps of the CMOS are used to form a N/MEMS in the following manner: a dielectric layer forms at the same time a sacrificial layer under the N/MEMS and the gate oxide of the CMOS, a layer of polysilicon or metal forms at the same time one of the structural layers of the N/MEMS and the gate electrode of the CMOS, and one or more conductive layers form at the same time structural layers of the N/MEMS and the gate, source and drain contacts of the CMOS. Some interconnection layers may also be used as structural layers of the N/MEMS. In addition, the sacrificial layers of the N/MEMS are made of the same material as the dielectric layers of the interconnections of the CMOS.

In this example of "intermediate-CMOS" approach, the choice of the materials that constitute the mechanical structure of the N/MEMS is also restricted, and particularly does not enable the use of monocrystalline semiconductor for the production of the N/MEMS. In addition, given that one or more structural layers of the N/MEMS stem from layers also forming the contacts of the CMOS, it is difficult to optimise the annealing that must make it possible not just to release the stresses in the polysilicon layers at the level of the N/MEMS but also to ensure the thermal diffusion of dopants in order to create the source and drain zones of the CMOS.

In addition, the use of polysilicon for the structural part of the N/MEMS at the same time as the production of the contacts of the CMOS does not enable the implementation of advanced microelectronics technologies enabling the production of very small transistors (short channels), the obtaining of high integration densities adapted to the N/MEMS, the efficient detection of the displacement in the N/MEMS, or instead to obtain efficient transistors, in particular for certain high frequency applications (for example to form a time base incorporating a N/MEMS comprising a resonating frequency greater than around 1 MHz or 1 GHz).

The document "NEMS devices for accelerometers compatible with thin SOI technology" of E. Ollier et al., IEEE-NEMS 07, Bangkok, Thailand, to 19 Jan. 2007, describes another example of "intermediate-CMOS" approach employing a "horizontal" integration, the objective being to form the CMOS circuit and the N/MEMS one beside the other on two different sections of a same silicon layer of a SOI (silicon on insulator) substrate. Thus, benefit is made of the electrical characteristics of the monocrystalline silicon layer for the CMOS part and its mechanical characteristics for the N/MEMS part.

However, in the method described by this document, the N/MEMS is not protected when the steps finishing the production of the CMOS circuit (production of contacts, interconnection layers, etc.) are implemented.

DESCRIPTION OF THE INVENTION

An aim of the present invention is to propose a method for production of a device with integrated circuit and N/MEMS making it possible to obtain a N/MEMS structure integrated substantially "horizontal" to the integrated circuit, not restricting the choice of the materials from which is formed the N/MEMS, and not deteriorating the N/MEMS during the production of the device.

To do this, the present invention proposes a method for production of a device comprising at least one integrated circuit and at least one N/MEMS, comprising at least the steps of:
  production of the N/MEMS in at least one upper layer arranged at least above a first section of a substrate,
  production of the integrated circuit in a second section of the substrate and/or in a layer based on semiconductor arranged at least above the second section of the substrate,
  and further comprising the production of a cover encapsulating the N/MEMS from at least one layer used for the production of a gate of the integrated circuit and/or for the production of at least one electrical contact of the integrated circuit.

The production of the cover encapsulating the N/MEMS could also be obtained from at least one layer used for the production of at least one interconnection layer of the integrated circuit.

Thus, the N/MEMS structure is manufactured before or during the Front-End steps of the integrated circuit, which preferably comprises a CMOS circuit. The encapsulation, or packaging, of the N/MEMS is achieved by means of a layer of material used by the CMOS method intervening either at the same time as the production of the gate of the transistor(s) of the CMOS circuit that the integrated circuit may comprise, or if necessary after this step, for example during the production of the electrical contacts or interconnection layers.

The N/MEMS may in particular be formed by implementing steps also forming the integrated circuit, which makes it possible to reduce the production costs of the device. In addition, the production of the encapsulation cover of the N/MEMS from a layer used for the production of a component of the integrated circuit also makes it possible to reduce the production costs of the device.

The cover makes it possible to ensure both a mechanical protection when the steps finishing the integrated circuit are implemented, as well as to control the environment of the N/MEMS, which may be arranged in a vacuum or in a gaseous or liquid environment. This method further makes it possible not to resort to an independent encapsulation structure transferred onto the N/MEMS.

Such a method also makes it possible to use a same material, for example semiconductor, for the integrated circuit and the N/MEMS, which is particularly advantageous when the device is formed from a monocrystalline substrate of SOI type, the integrated circuit benefiting from the good electrical properties of the monocrystalline material and the N/MEMS benefiting from the good mechanical properties of the monocrystalline material. In addition, this approach can make it possible to implement specific detection means adapted to the nanometric scale of NEMS, such as for example the detection by lateral transistor with movable gate.

In a preferential manner, the carrying out of the encapsulation of the N/MEMS uses the steps of production of the gate of the integrated circuit.

This method makes it possible to minimise as much as possible reconsiderations of the CMOS method, which enables the implementation of state of the art microelectronics technologies. It makes it possible in particular to:
  make very small transistors (short channels) for the detection of displacement in the N/MEMS,
  continue the evolution of the integration density of the N/MEMS,
  co-integrate in the N/MEMS very efficient transistors necessary for certain high frequency applications (for example a time base incorporating a N/MEMS, the oscillation frequency of which may be greater than 1 MHz or 1 GHz).

The upper layer may be based on at least one semiconductor.

The upper layer and the semiconductor layer arranged above the second section of the substrate may be formed of a same layer based on semiconductor.

The integrated circuit may comprise at least one transistor, the gate of the integrated circuit being able to comprise at least one transistor gate.

A channel of the transistor may be formed in the second section of the substrate or in the semiconductor layer arranged above the second section of the substrate.

The transistor may be of the MOSFET, MESFET, bipolar, FinFET, triple gate, gate all round type, or of lateral MOS with movable gate type.

The cover and the gate of the integrated circuit may be formed by steps of photolithography and etching of at least one same layer based on an electrically conducting material.

The gate may be based on at least one metal and/or polysilicon.

The cover may be arranged on dielectric sections derived from a dielectric layer used for the production of a gate oxide of the integrated circuit.

The upper layer and/or the layer based on semiconductor arranged above the second section of the substrate and/or the substrate may be based on monocrystalline silicon.

The semiconductor layer arranged above the second section of the substrate and/or the upper layer being able to form, with the substrate, a SOI type substrate, the semiconductor layer arranged above the second section of the substrate and/or the upper layer being able to form the superficial layer of the SOI substrate.

The thickness of the upper layer and/or the layer based on semiconductor arranged above the second section of the substrate may be less than around 1 µm.

The method may further comprise, when the cover is formed from a layer used for the production of the gate, between the step of production of the cover and a step of production of interconnection layers of the integrated circuit, a step of production of at least one layer based on a dielectric material on the cover and on the integrated circuit.

In this case, the method may further comprise, between the step of production of the layer of dielectric material and the step of production of the interconnection layers, a step of production of contacts based on at least one electrically conductive material forming electrical contacts connected to the integrated circuit and/or to the cover and/or to the N/MEMS.

The step of production of the cover may also form at least one pillar between the cover and the N/MEMS.

The method may further comprise, after the production of the N/MEMS, a step of etching of a first sacrificial layer located between the upper layer and the substrate.

The method may further comprise, after the production of the cover, a step of etching of a second sacrificial layer located between the cover and the semiconductor layer.

The method may further comprise, after the production of the cover, a step of etching of a sacrificial material arranged in cavities formed in the N/MEMS and/or around the N/MEMS.

The first sacrificial layer and/or the second sacrificial layer and/or the sacrificial material may be based on at least one material that may be etched selectively compared to the upper layer.

The first sacrificial layer and/or the second sacrificial layer and/or the sacrificial material may be based on silicon oxide and/or silicon-germanium.

The first sacrificial layer may comprise at least one section of silicon-germanium at the level of the location of the N/MEMS, while the remainder of the first sacrificial layer may be based on silicon oxide.

The etching of the first sacrificial layer and/or the etching of the second sacrificial layer and/or the etching of the sacrificial material may be carried out through at least one opening formed through the cover.

The method may further comprise, after the formation of interconnection layers of the integrated circuit, the formation of at least one opening through the interconnection layers and the cover, forming a communication channel between the N/MEMS and the exterior environment.

The N/MEMS may be formed by steps of photolithography and etching in the semiconductor layer.

The steps of photolithography and etching forming the N/MEMS may also form insulation trenches of the integrated circuit.

The method may further comprise, before the production of the N/MEMS, a step of etching of the substrate, forming a lower zone and an upper zone, the N/MEMS then being able to be formed at the level of the lower zone and the integrated circuit being able to be formed at the level of the upper zone.

In this case, the face of the upper layer located on the side opposite to the substrate may be arranged between a plane passing through the face of the substrate at the level of the upper zone and a plane passing through the face of the substrate at the level of the lower zone.

The present invention also relates to a device comprising:
at least one N/MEMS formed in at least one upper layer arranged at least above a first section of the substrate,
at least one integrated circuit formed in a second section of the substrate and/or in a layer based on semiconductor arranged at least above the second section of the substrate,
a cover encapsulating the N/MEMS, based on at least one material similar to the material of a gate of the integrated circuit and/or at least one electrical contact of the integrated circuit.

The cover encapsulating the N/MEMS could also be based on at least one material similar to the material of at least one interconnection layer of the integrated circuit.

The advantages described previously with reference to the production method according to the invention also apply to this device.

This device further makes it possible, thanks to the co-integration carried out, to obtain measurable signals on structures of micrometric or nanometric size, thereby making it possible to form ultra-miniature devices, having a low consumption, a rapid response time, a high sensitivity to exterior forces or to an addition of weight. In addition, very high resonance frequencies may be obtained.

Thus, this type of device is particularly well adapted to ultimate sensitivity sensors, to autonomous sensors and battery operated systems. In addition, this type of device may be mass produced at low cost, particularly for the production of accelerometers (which may be used for example for the protection of hard drives, mobile telephone interfaces, personal assistants, movement sensors or instead time reference).

The cover and the gate of the integrated circuit may be based on at least one same electrically conductive material.

The substrate may comprise a lower zone and an upper zone, the N/MEMS being able to be formed at the level of the lower zone and the integrated circuit that may be able to be formed at the level of the upper zone.

The N/MEMS may be arranged in a cavity formed between the substrate and the cover.

The cover may be covered by at least one dielectric layer also covering the integrated circuit and through which are formed electrical contacts connected to the integrated circuit and/or to the semiconductor layer and/or to the cover and/or to the N/MEMS, and/or to the interconnection layers also formed above the integrated circuit.

BRIEF DESCRIPTION OF DRAWINGS

The present invention will be better understood on reading the description of embodiments given purely by way of indication and in no way limiting and by referring to the appended drawings, in which.

Identical, similar or equivalent parts of the different figures described hereafter bear the same numerical references so as to make it easier to go from one figure to the next.

In order to make the figures more legible, the different parts represented in the figures are not necessarily shown at the same scale.

The different possibilities (alternatives and embodiments) must be understood as not being mutually exclusive and may be combined together.

DETAILED DESCRIPTION OF SPECIFIC EMBODIMENTS

Figure 1:
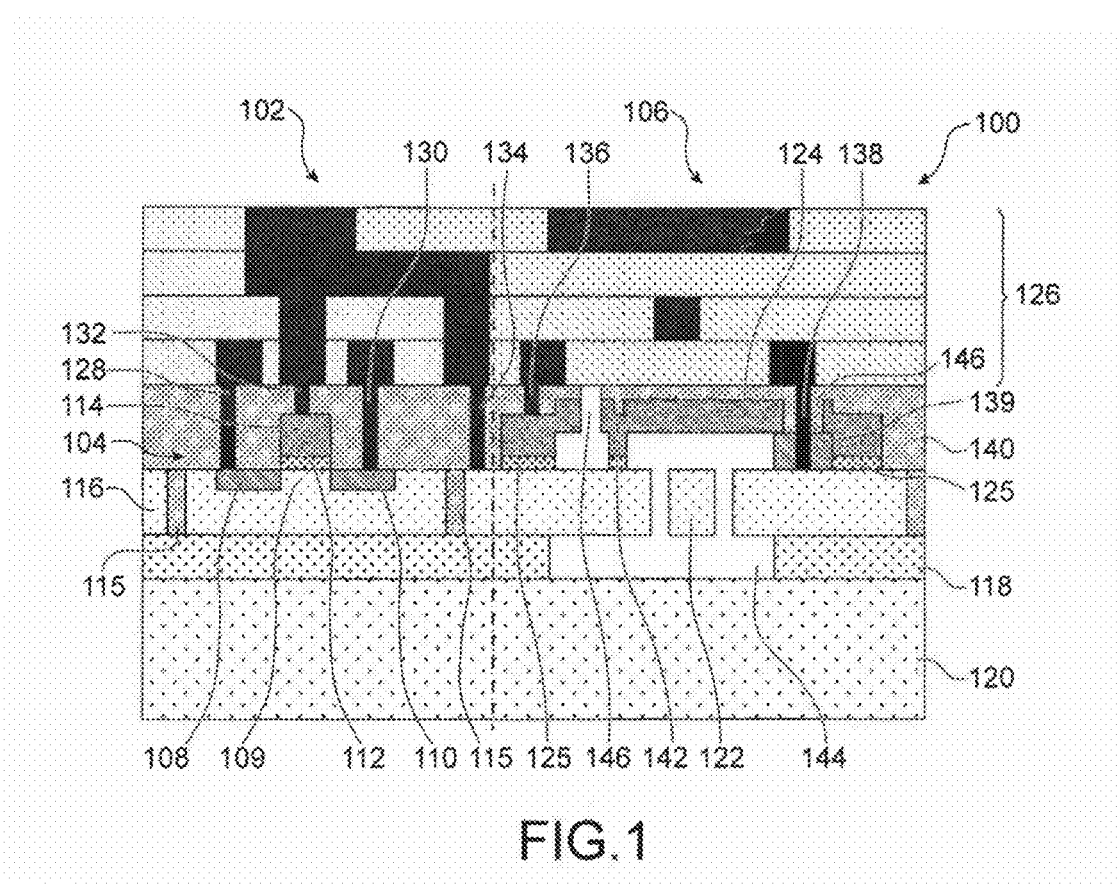
FIG. 1 represents an example of device with integrated circuit and encapsulated N/MEMS, object of the present invention, obtained by the implementation of a method for production also object of the present invention.

Reference is firstly made to FIG. 1, which represents an example of device 100 comprising a N/MEMS and an integrated circuit, for example of CMOS type.

This device 100 comprises a first part 102 at the level of which is formed the integrated circuit, here a MOSFET transistor 104, and a second part 106 at the level of which is formed a N/MEMS 122.

The transistor 104 comprises at least one source 108, a channel 109, a drain 110, a gate oxide 112 and a gate 114. The sources 108 and drain 110 are formed in a semiconductor layer 116, for example based on monocrystalline silicon, forming the superficial layer of a SOI substrate also comprising a dielectric layer 118, for example based on silicon oxide, and a base substrate 120 that can be based on silicon. The sources 108 and drain 110 are formed for example by a localised implantation of dopants in the upper silicon layer 116. Insulation trenches 115 are also formed in the upper silicon layer 116.

Preferably, the upper layer 116 is a thin film (thickness less than around 1 μm) or ultra-thin film (thickness less than around 100 nm). Thus, it is possible to form integrated circuits with fully depleted or partially depleted transistor.

In a production alternative, the device 100 may also be formed from a "bulk" substrate, comprising a single semiconductor layer, for example based on monocrystalline silicon, or instead from a SON (silicon on nothing, an upper layer of silicon being separated from a base substrate by a layer of SiGe that may be locally removed) type substrate.

The N/MEMS 122 is formed in the upper silicon layer 116, and is covered by a cover 124 leaving the N/MEMS 122 free of movement. In the example of FIG. 1, the cover 124 and the gate 114 of the transistor 104 are formed during a single and same step. The cover 124 and the gate 114 are thus based on the same electrically conducting material. The cover 124 makes it possible to separate the N/MEMS 122 from interconnection levels 126 of the transistor 104. In this first embodiment, the cover 124 and the gate 114 may be obtained from at least one metal and/or polysilicon. They can also be obtained from several layers based on at least one material suited to the production of the cover 124 and the gate 114. In addition, in the example of FIG. 1, the cover 124 is arranged on dielectric sections 125 stemming from the layer of dielectric material used to form the gate oxide 112 of the transistor 104.

The interconnection levels 126 are here formed by dielectric layers (for example based on silicon dioxide or nitride) in which are formed sections based on electrically conductive material such as metal, for example aluminium and/or copper, and/or polycrystalline silicon. These interconnection levels 126 can moreover make it possible to ensure a protection of the N/MEMS 122 vis-à-vis exterior light in addition to the cover 124.

The device 100 of FIG. 1 further comprises several electrical connection components:
 a first electrical contact 128 connected to the source 108,
 a second electrical contact 130 connected to the drain 110,
 a third electrical contact 132 connected to the gate 114,
 a fourth electrical contact 134 connected to the upper layer 116.

Each electrical contact is connected to one of the interconnection layers 126, thereby making them accessible from the exterior of the device 100.

One or more electrical contacts (a single contact 136 is represented in FIG. 1) electrically connect the cover 124 to one of the interconnection layers 126. In addition, one or more electrical contacts (a single contact 138 is represented in FIG. 1) ensure the electrical connection from the N/MEMS 122 to at least one of the interconnection layers 126 and/or to the CMOS transistor 104. In the example of FIG. 1, the contact 138 is formed through a section 139 based on a dielectric material arranged on the N/MEMS 122.

In the example of FIG. 1, the device 100 comprises a dielectric layer 140 formed on the upper semiconductor layer 116, covering the transistor 104 and the cover 124 and thereby insulating them from the interconnection layers 126. In addition, this dielectric layer 140 encompasses the parts of the electrical contacts 128, 130, 132, 134, 136, 138 located under the interconnection layers 126. This dielectric layer 140 is in this example based on silicon dioxide or silicon nitride.

It is possible that the device 100 also comprises one or more pillars 142, ensuring a mechanical support of the cover 124 to avoid it deforming or collapsing in a cavity 144 in which is formed the N/MEMS 122 under the effect of the applied stresses (material stresses, stresses induced by the technology of the interconnections, exterior pressure, packaging, etc.).

During the production of the device 100, the N/MEMS 122 is released by an etching of one or more sacrificial layers on and/or under which is formed the N/MEMS 122, making it possible to separate the N/MEMS 122 from the cover 124 and from the base substrate 120. In the example of FIG. 1, the N/MEMS 122 is released from the layer of oxide 118 and from the substrate 120 by etching through one or more vertical holes, or openings, 146 here formed through the cover 124. The sacrificial layer or layers may also be based on silicon-germanium, particularly when the substrate used is of SON type, the upper layer then being based on monocrystalline silicon obtained by epitaxy from the layer of silicon-germanium itself epitaxied on the silicon based substrate.

In the case of a SOI type substrate, as is the case in FIG. 1, the release of the N/MEMS 122 is carried out by etching with stoppage over time. The released distance is in this case dependent on the geometry of the structure of the N/MEMS 122. The same is true in the case of a release of the N/MEMS 122 vis-à-vis the cover 124 in the case of sacrificial layers based on a same material, for example of silicon dioxide as in the example of FIG. 1. In this case, it is possible to spread out in a substantially regular manner the holes 146 on the whole of the cover 124 as a function of the structure of the N/MEMS 122. In the case where two sacrificial layers of different nature are used, it is possible to place holes 146 of the cover 124 in the periphery of the cover 124 and the N/MEMS 122, to carry out a complete release of the first sacrificial layer, without time constraint and control of the release distance, then to carry out a second release, of the second sacrificial layer. In all cases, the release holes formed in the cover 124 may be filled with an appropriate material, for example with silicon dioxide and/or nitride and/or silicon and/or metal. This filling material may also stem from a layer deposited during the production of a component of the transistor 104 (material of the contacts, the interconnection layers, etc.).

The device 100 may also comprise at least one channel, not represented in FIG. 1, placing in communication the N/MEMS 122 and the exterior environment of the device 100, particularly when the N/MEMS 122 is for example a pressure sensor or a chemical sensor. This channel may for example be formed by an opening formed through the interconnection levels 126 and the cover 124. To do this, an exclusion of the metals of the interconnection layers 126 must be made at the level of the desired opening. A lithography followed by an etching of the dielectric layer 140 then makes it possible to make the N/MEMS 122 communicate with the exterior of the device 100.

In a production alternative, the transistor 104 may be of MESFET (Schottky controlled field effect transistor), bipolar, FinFET (fin type field effect transistor), trigate (triple gate transistor), GAR (transistor with gate all round) type, etc.

In another alternative, the transistor 104 may be of lateral MOS with movable gate type, in other words comprising a channel perpendicular to a plane passing through the drain, the source and the gate, and the gate of which is movable in relation to the drain and the source. In this case, the transistor with movable gate can ensure a mechanical-electrical transduction of the movements of the N/MEMS 122.

In a production alternative, the cover 124 may be obtained from a step of production of a component of the transistor 104 other than the gate 114, for example from the material of the contacts 128, 130, 132, 134, or from one of the materials of the interconnection layers 126 (dielectric or conductor).

Reference will now be made to FIGS. 2A to 2D, which represent the steps of a method for production of the device 100 according to a first embodiment.

Figure 2A:
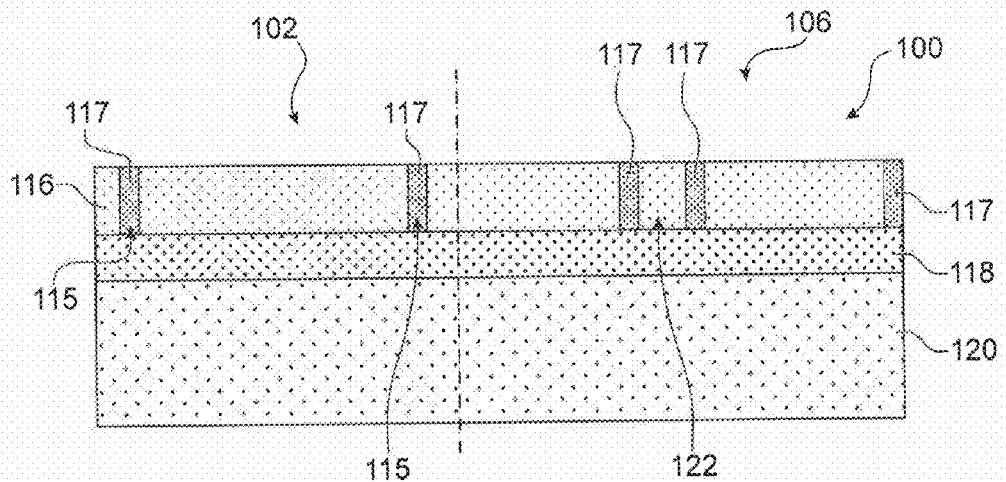
FIGS. 2A to 2D represent the steps of a method for production of a device with integrated circuit and encapsulated N/MEMS, object of the present invention, according to a first embodiment.

As represented in FIG. 2A, firstly a structuring of the mechanical N/MEMS part 122 is carried out in the upper silicon layer 116 of the SOI substrate formed by this upper layer 116, the dielectric layer 118 and the base substrate 120. In this first embodiment, the insulation trenches 115, intended to insulate the transistor 104 of the device 100, are also formed in the upper layer 116, during this same structuring. The device 100 thus comprises a part 102 at the level of which is going to be formed the transistor 104, and a part 106 at the level of which is formed the N/MEMS 122.

This structuring is for example carried out firstly by a deposition of a layer of oxide and a layer of nitride (not represented) on the upper silicon layer 116, intended to form a hard mask. A step of photolithography of the patterns of the insulation trenches 115 and the N/MEMS 122 is then implemented. The layers of nitride, oxide and the upper silicon layer 116 are etched according to the pattern previously photolithographied. The etched pattern is then filled with a dielectric 117, for example $SiO_2$. A chemical mechanical polishing is then carried out with stoppage on the layer of nitride to eliminate the dielectric extending beyond the etched pattern. The layers of nitride and oxide are then eliminated, for example by etching.

Thus preferably the insulation trenches 115 are formed and the structuring of the N/MEMS 122 is carried out from the same photolithography and etching steps. In an alternative, it is possible that the structuring of the insulation trenches 115 is carried out before the structuring of the N/MEMS part 122, or inversely. The structuring in the upper silicon layer 116 is then carried out in two stages. The structuring of the N/MEMS 122 may be carried out before the insulation trenches 115 if the dimensions of the pattern to be etched for the N/MEMS 122 are critical compared to those of the insulation trenches 115.

Then one (or more) doping(s) of the upper silicon layer 116 are carried out. This (or these) doping(s) is (are) intended to form the channel 109 of the transistor 104 and to adjust the resistivity of the material forming the N/MEMS 122. Said doping is for example carried out by a step of ion implantation implemented through a mask based on resin, oxide, or instead SiGe deposited on the upper silicon layer 116, said mask being for example formed by a step of photolithography and etching. At least one implantation annealing than makes it possible to activate the dopants introduced in the silicon layer 116 and to reduce the dislocations present in this layer.

Figure 2B:
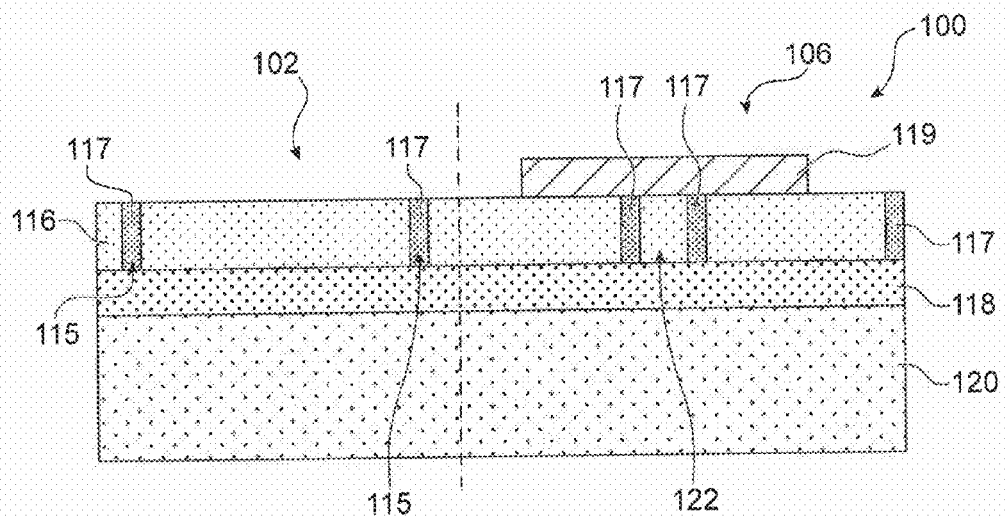

A sacrificial layer 119 (FIG. 2B) is then formed, for example based on silicon dioxide and/or silicon-germanium, obtained by deposition or epitaxy on the upper silicon layer 116. This layer 119 is then structured by implementing for example steps of photolithography and etching. In FIG. 2B, only one section of the sacrificial layer 119 is conserved above the N/MEMS 122.

Preferably, the steps of doping and annealing are carried out before the production and the structuring of the sacrificial layer 119. However, it is possible to inverse the order of implementation between the doping and the production/structuring of the sacrificial layer 119.

Figure 2C:
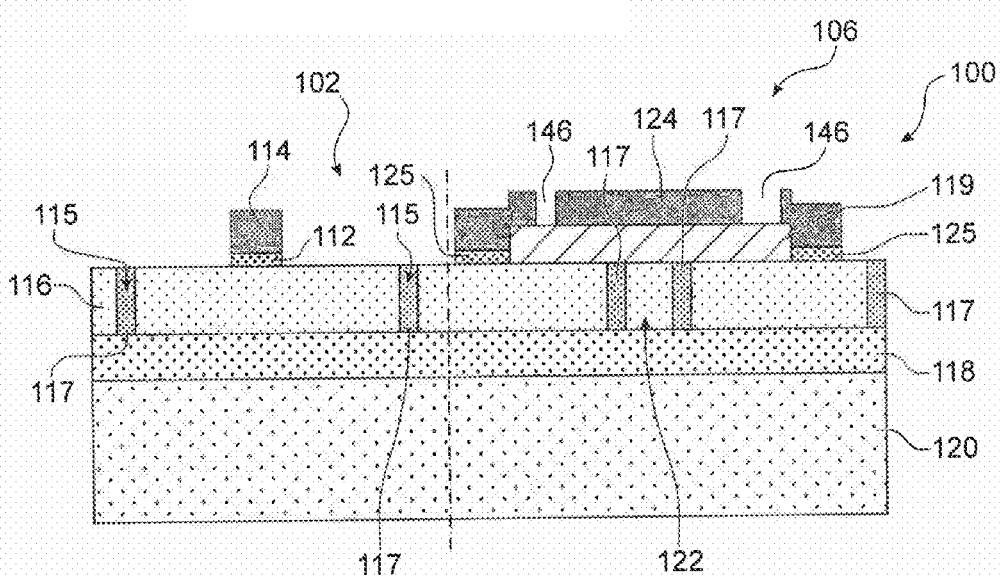

Then the gate oxide 112 and the gate 114 of the transistor 104 are formed, as well as the protective cover 124 of the N/MEMS structure 122, from same steps of photolithography and etching, by using common masks (FIG. 2C).

To do this, firstly a thermal oxidation of the semiconductor layer 116 is carried out, forming on it a dielectric layer based on silicon oxide. A layer, for example based on polysilicon and/or metal, is deposited on this dielectric layer. A step of photolithography and a step of etching of the dielectric layer and the layer of polysilicon and/or metal are then implemented. One of the remaining sections of the dielectric layer forms the gate dielectric 112. The remaining sections of the layer of polysilicon and/or metal form the gate 114 as well as the cover 124 comprising in this example of production of holes 146 formed by the steps of photolithography and etching. The cover 124 is arranged on remaining sections 125 of the dielectric layer etched previously.

The release of the N/MEMS 122 is then carried out. To do this, firstly a material intended to protect the part 102 comprising the transistor 104 is deposited. This material, for example a nitride, is capable of resisting the etching agents that will be used subsequently to etch a part of the dielectric layer 118 and a part of the sacrificial layer 119. A photolithography and an etching are carried out to eliminate the protective material at the level of the holes 146. The part of the sacrificial layer 119 connected to the cover 124 and to the N/MEMS 122 is then etched through the intermediary of the holes 146 formed previously in the cover 124. The dielectric material 117 located at the level of the N/MEMS 122 is also etched, as well as a part of the dielectric layer 118, thereby releasing the N/MEMS 122 and forming a cavity 144 in which is located the N/MEMS 122.

A filling of the holes 146 formed previously through the cover 124 may then be carried out. To do this, a filling material, for example silicon dioxide and/or nitride and/or silicon and/or metal, is deposited on the device 100 and particularly in the holes 146. The layer of the filling material is then photolithographied and etched so as to only conserve the sections of this material located in the holes 146.

The material protecting the part 102 of the device 100 is then eliminated by etching.

The source 108 and the drain 110 of the transistor 104 are then formed by direct ion implantation or through a mask deposited beforehand. The dielectric layer 140 is then deposited over the whole of the device 100. The contacts 128, 130, 132, 134, 136, 138 connected respectively to the source 108, to the drain 110, to the gate 114, to the upper layer 116, to the cover 124 and to the N/MEMS 122, are formed by photolithography and etching of the dielectric layer 140, thereby forming openings in which is (are) deposited the conductive material(s) used to form the contacts, for example titanium and/or platinum and/or silicon and/or tungsten. Steps of silicidation (for example of NiSi, PtSi, etc.) may be implemented before the deposition of the contact material(s) in order to optimise the properties of the contacts, in particular to reduce the contact resistances. The conductive material located outside of the openings is eliminated, for example by photolithography and etching, or chemical mechanical planarisation (see FIG. 2D).

In an alternative of the method described here, the filling material may stem from a layer intended to form a component of the transistor 104. For example, this filling material may be the material deposited during the production of the contacts 128 to 138, or instead stem from the dielectric layer 140. In addition, it is possible to carry out the release of the N/MEMS 122 between the production of the source and the drain and the production of the dielectric layer 140, or between the production of the dielectric layer 140 and the production of the contacts, or after the production of the contacts of the device 100.

Preferably, the step of implantation intended to form the source and the drain are first carried out, then the production of the dielectric layer 140, then the production of the contacts 128 to 138, and finally the release of the N/MEMS 122. Thus, it is possible to conserve the protective layer deposited for the release of the N/MEMS, the thickness of which may be chosen by a subsequent step of planarisation or etching.

Finally, the interconnection layers 126 are formed by depositing successively layers of dielectric material, for example based on oxide or nitride, by carrying out a photolithography and an etching of said dielectric material at the level of the interconnection positions, then by depositing one or more materials, for example copper and/or aluminium and/or silicon in the etched positions. Steps of chemical mechanical planarisation or photolithography and etching of the metallic material are implemented to localise this material at the necessary places. The device 100 represented in FIG. 1 is thereby obtained.

Reference will now be made to FIGS. 3A to 3F, which represent the steps of a method for production of a device 200 with integrated circuit and encapsulated N/MEMS according to a second embodiment. In the example of production described, the device comprises the N/MEMS 122 and the transistor 104 described previously in contact with the device 100.

Figure 3A:
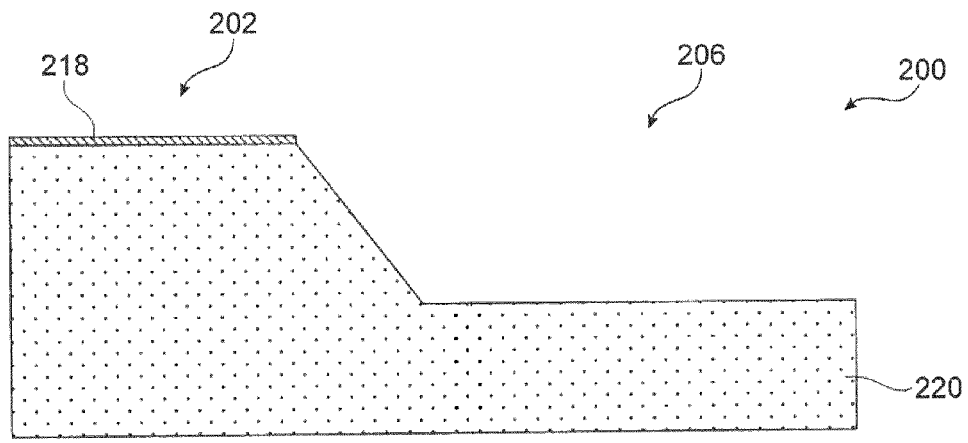
FIGS. 3A to 3F represent the steps of a method for production of a device with integrated circuit and encapsulated N/MEMS, object of the present invention, according to a second embodiment.

In this second embodiment, the device 200 is formed from a bulk silicon substrate 220. Said substrate 220 is covered by a protective layer 218 based on dielectric, for example silicon dioxide or nitride, formed by a deposition. A step of photolithography and a step of dry or wet etching (for example based on KOH) make it possible to eliminate a section of this protective layer 218 located at the level of a zone 206 of the device 200 at the level of which will be formed the N/MEMS 122. A part of the substrate 220, at the level of the zone 206 of the device 200, is then etched, thereby forming an emplacement for the production of the N/MEMS 122 (FIG. 3A).

A sacrificial layer 219, for example based on silicon dioxide or silicon-germanium, is then deposited on the substrate 220 (as well as on the protective layer 218). An active layer 216, for example based on a semiconductor such as silicon, in which is intended to be formed the N/MEMS 122, is then deposited on the sacrificial layer 219. This active layer 216 may in particular be based on monocrystalline silicon when the sacrificial layer 219 is based on silicon-germanium.

Figure 3B:
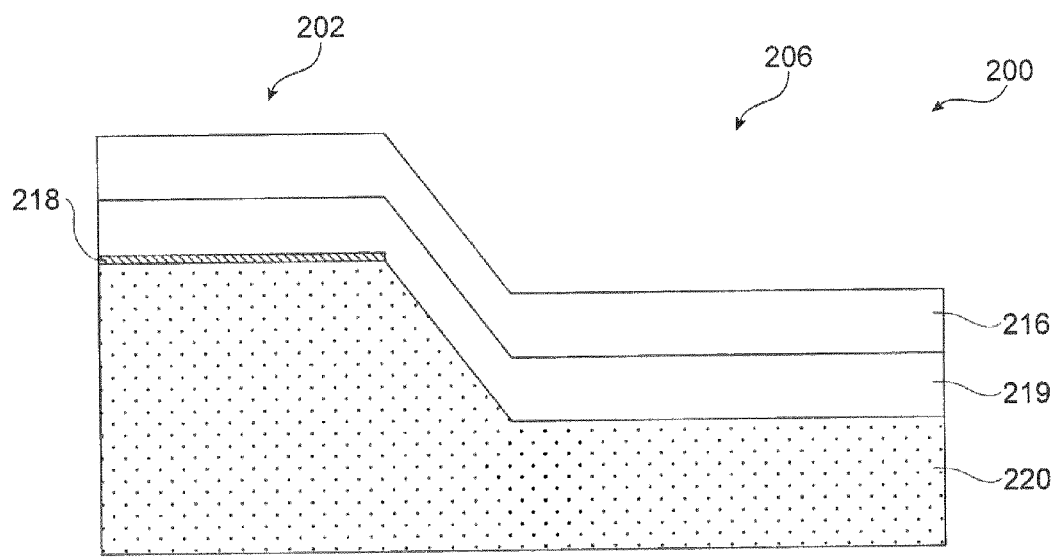

The thicknesses of the sacrificial layer 219 and the active layer 216, as well as the etched thickness of the substrate 220 at the level of the zone 206, are chosen such that the upper face of the active layer 216 is located at the most at the same level as, or below, the upper face of the substrate 220 at the level of the zone 202 of the device 200 (FIG. 3B).

Figure 4A:
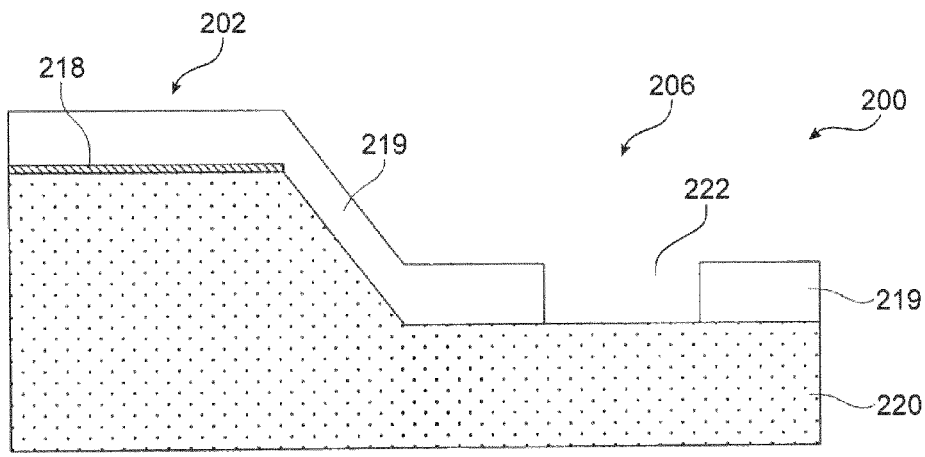
FIGS. 4A and 4B represent steps of a method for production of a device with integrated circuit and encapsulated N/MEMS, object of the present invention, according to an alternative of the second embodiment.

In an alternative, in order to electrically insulate the N/MEMS 122 that will be produced in the active layer 216, it is possible to form a sacrificial layer 219 based on a dielectric comprising a sacrificial section based on silicon-germanium arranged under the active part of the N/MEMS 122. To do this, as represented in FIG. 4A, the layer 219 based on a dielectric, for example silicon dioxide, is deposited on the substrate 220 and the protective layer 218. A structuring of this layer 219 is then carried out, for example by photolithography and etching, in order to form an opening 222 in the layer 219 and thereby form an active zone at the level of the location of the N/MEMS 122.

Figure 4B:
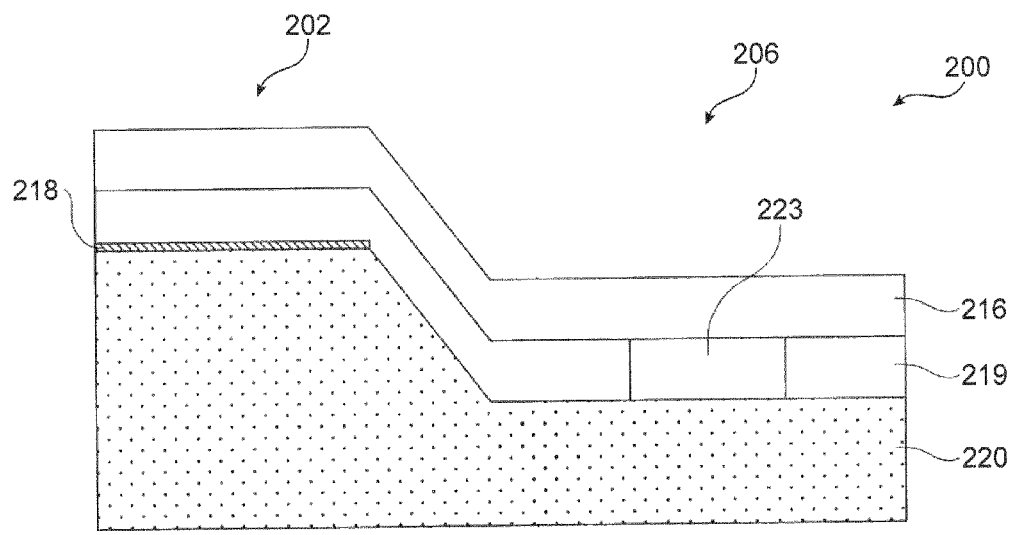

Then, in a selective manner, a layer based on silicon-germanium is deposited in the opening 222, forming a section 223 of silicon-germanium in the layer 219, then an epitaxy of the active layer 216 (FIG. 4B) is carried out. When the active layer 216 is based on silicon, the section of the layer 216 located above the section 223 of silicon-germanium, in the place where the N/MEMS 122 will be formed, is based on monocrystalline silicon, the remainder of the layer 219 being based on polycrystalline silicon.

Figure 3C:
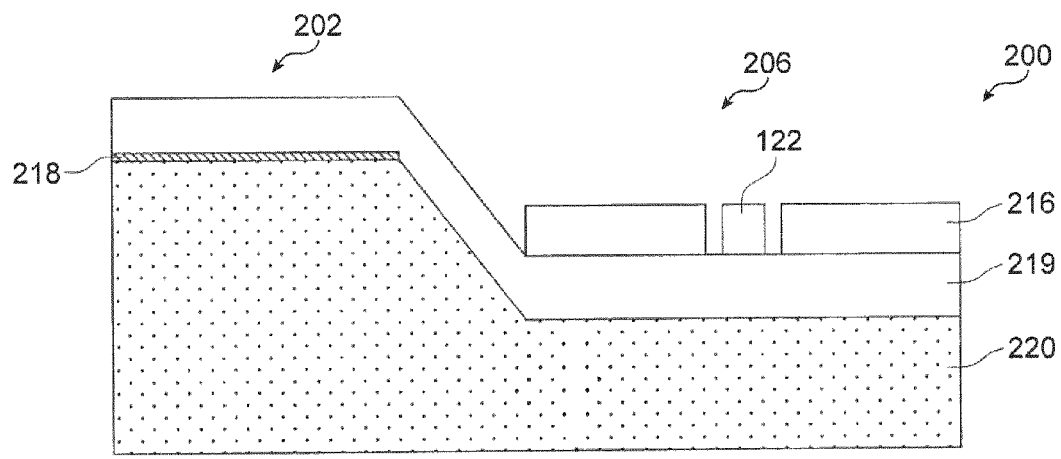

As represented in FIG. 3C, a structuring of the active layer 216 is then carried out, to form the N/MEMS 122. As in the first embodiment, this structuring is carried out in an advantageous manner at the same time as the production of the insulation trenches of the CMOS part (these trenches not being represented in FIGS. 3A to 3F). To do this, the sections of the active layer 216 not located in the zone 206 intended to comprise the N/MEMS 122, in other words the sections of the active layer 216 located at the level of the zone 202 of the device 200, are eliminated for example by photolithography and etching. The remaining section of the active layer 216 is also photolithographied then etched during these two steps to form the mechanical structure of the N/MEMS 122.

Then one or more dopings are carried out by ion implantation in the mechanical structure of the N/MEMS 122, for example by resorting to a hard mask made of a dielectric such as silicon dioxide by photolithography and etching, as for the device 100 described previously. This or these dopings are also carried out at the level of the CMOS part to form the wells of the transistors in which will be formed the channels of the transistors. After the implantation, the device 200 is subjected to an annealing, and then the hard mask is eliminated by etching.

Figure 3D:
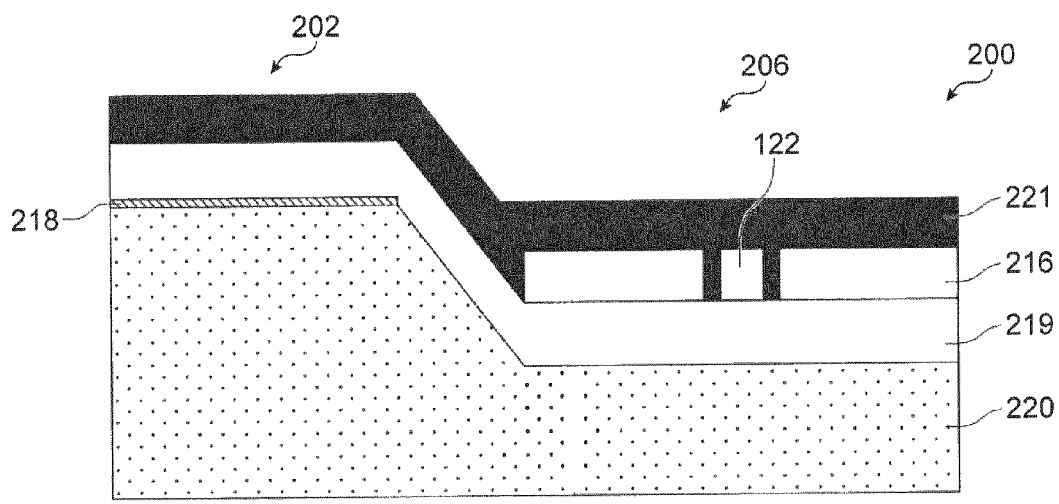

As represented in FIG. 3D, a second sacrificial layer 221 is then deposited on the device 200.

The second sacrificial layer 221 may then be structured to form for example pillars intended to support the cover 124 that will encapsulate the N/MEMS 122.

Figure 3E:
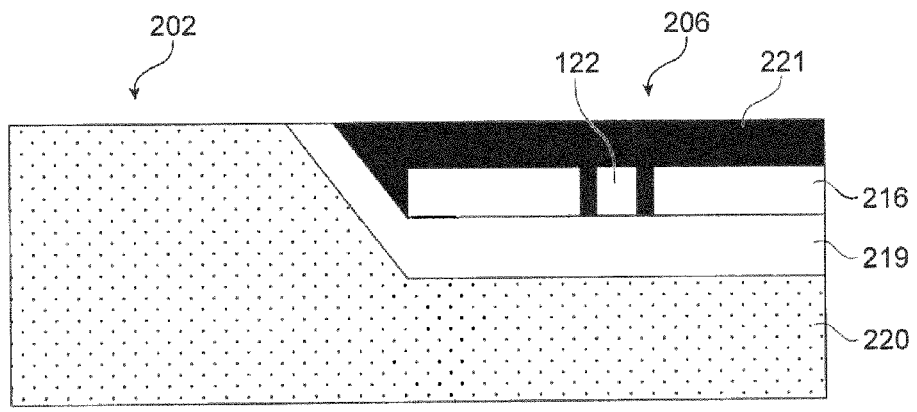

As represented in FIG. 3E, a step of chemical mechanical planarisation is then carried out with stoppage on the protective layer 218 in order to eliminate the sections of the second sacrificial layer 221 and the first sacrificial layer 219 located at the level of the zone 202 of the device 200. The protective layer 218 is also eliminated, for example by etching.

In the example of FIG. 3E, the face of the semiconductor layer 216 located opposite the substrate 220 is arranged between a plane passing through the face of the substrate 220 at the level of the zone 202 and a plane passing through the face of the substrate 220 at the level of the zone 206. This characteristic is obtained by choosing appropriate thicknesses for the silicon layer 216 and the sacrificial layers 219 and 221. In an alternative, these thicknesses may be chosen so that the face of the semiconductor layer 216 located on the side opposite to the substrate 220 is at the level of the face of the substrate 220 at the level of the zone 202. A configuration substantially similar to the device 100 is thereby obtained, where the transistor 104 is at the same level as the N/MEMS 122.

Figure 2D:
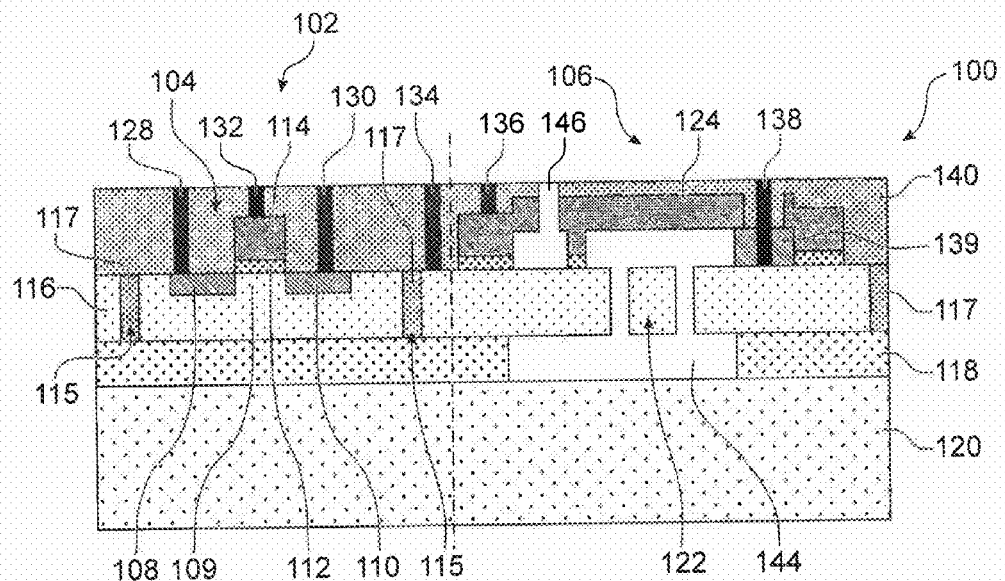
Figure 3F:
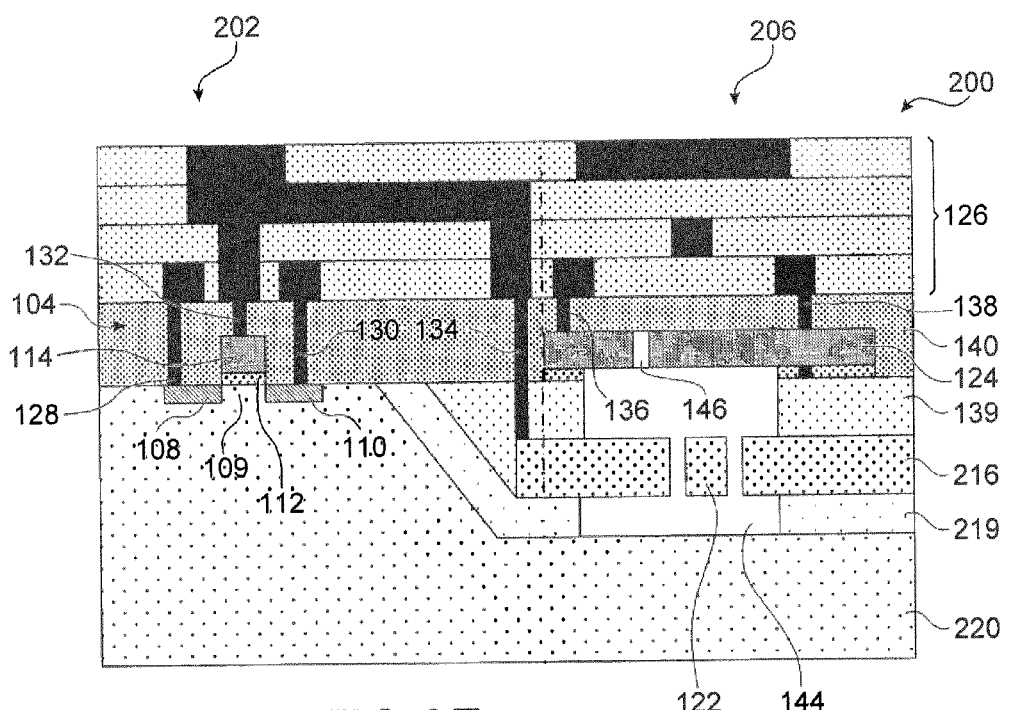

The steps described with reference to FIGS. 2C to 2D and 1 (production of the transistor 104, production of the cover 124, release of the N/MEMS 122, production of the contacts 128, 130, 132, 134, 136, production of the interconnection layers 126) are then implemented, for example in a similar manner to the first embodiment described previously, to finish the production of the device 200. The device 200 represented in FIG. 3F is thereby obtained, comprising similar components to those of the device 100 according to the first embodiment. When the layer 219 comprises a section 223 based on silicon-germanium, the release of the N/MEMS 122 is in particular formed by etching this section 223 located under the N/MEMS 122.

In an alternative, the step of structuring of the sacrificial layer 221 may be carried out after the production of the transistor 104.

The invention claimed is:

1. A method for production of a device including at least one integrated circuit and at least one N/MEMS, comprising:
production of the N/MEMS in at least one upper layer arranged at least above a first section of a substrate;
production of the integrated circuit in a second section of the substrate and/or in a layer based on semiconductor arranged at least above the second section of the substrate; and
production of a cover encapsulating the N/MEMS from at least one layer used for production of a gate of the integrated circuit.

2. The method according to claim 1, the upper layer being based on at least one semiconductor.

3. The method according to claim 2, the upper layer and the semiconductor layer arranged above the second section of the substrate being formed by a same layer based on semiconductor.

4. The method according to claim 1, the integrated circuit including at least one transistor, the gate of the integrated circuit including at least one transistor gate.

5. The method according to claim 4, a channel of the transistor being formed in the second section of the substrate or in the semiconductor layer arranged above the second section of the substrate.

6. The method according to claim 4, the transistor being of MOSFET, MESFET, bipolar, FinFET, triple gate, gate all round type, or lateral MOS with movable gate type.

7. The method according to claim 1, the cover and the gate of the integrated circuit being formed from at least one same layer based on an electrically conducting material.

8. The method according to claim 7, the cover and the gate being formed by photolithography and etching of the layer of electrically conductive material.

9. The method according to claim 1, the gate being based on at least one metal and/or polysilicon.

10. The method according to claim 1, the cover being arranged on dielectric sections stemming from a dielectric layer used for production of a gate oxide of the integrated circuit.

11. The method according to claim 1, the upper layer and/or the layer based on semiconductor arranged above the second section of the substrate and/or the substrate being based on monocrystalline silicon.

12. The method according to claim 1, the semiconductor layer arranged above the second section of the substrate and/or the upper layer forming, with the substrate, a SOI type substrate, the semiconductor layer arranged above the second section of the substrate and/or the upper layer forming a superficial layer of the SOI substrate.

13. The method according to claim 1, a thickness of the upper layer and/or the layer based on semiconductor arranged above the second section of the substrate being less than around 1 μm.

14. The method according to claim 1, further comprising, between the production of the cover and a production of interconnection layers of the integrated circuit, production of at least one layer based on a dielectric material on the cover and on the integrated circuit.

15. The method according to claim 14, further comprising, between the production of the layer of dielectric material and the production of the interconnection layers, production of contacts based on at least one electrically conductive material forming electrical contacts connected to the integrated circuit and/or to the cover and/or to the N/MEMS.

16. The method according to claim 1, the production of the cover also forming at least one pillar between the cover and the N/MEMS.

17. The method according to claim 1, further comprising, after the production of the N/MEMS, etching a sacrificial layer located between the upper layer and the substrate.

18. The method according to claim 1, further comprising, after the production of the cover, etching a sacrificial layer located between the cover and the semiconductor layer.

19. The method according to claim 1, further comprising, after the production of the cover, etching a sacrificial material arranged in cavities formed in the N/MEMS and/or around the N/MEMS.

20. The method according to claim 17, the sacrificial layer being based on at least one material that may be etched selectively compared to the upper layer or based on silicon oxide or silicon-germanium.

21. The method according to claim 18, the sacrificial layer being based on at least one material that may be etched selectively compared to the upper layer or based on silicon oxide or silicon-germanium.

22. The method according to claim 19, the sacrificial material being based on at least one material that may be etched selectively compared to the upper layer or based on silicon oxide or silicon-germanium.

23. The method according to claim 20, the sacrificial layer including at least one section of silicon-germanium at a level of a position of the N/MEMS, a remainder of the sacrificial layer being based on silicon oxide.

24. The method according to claim 17, the etching of the sacrificial layer being carried out through at least one opening formed through the cover.

25. The method according to claim 18, the etching of the sacrificial layer being carried out through at least one opening formed through the cover.

26. The method according to claim 19, the etching of the sacrificial material being carried out through at least one opening formed through the cover.

27. The method according to claim 1, further comprising, after production of interconnection layers of the integrated circuit, production of at least one opening through the interconnection layers and the cover, forming a communication channel between the N/MEMS and an exterior environment.

28. The method according to claim 1, the N/MEMS being formed by photolithography and etching in the semiconductor layer.

29. The method according to claim 28, the photolithography and etching forming the N/MEMS also forming insulation trenches around the integrated circuit.

30. The method according to claim 1, further comprising, before the production of the N/MEMS, etching the substrate, forming a lower zone and an upper zone, the N/MEMS then being formed at a level of the lower zone and the integrated circuit being formed at a level of the upper zone.

31. The method according to claim 30, a face of the upper layer located on a side opposite to the substrate being arranged between a plane passing through a face of the substrate at the level of the upper zone and a plane passing through the face of the substrate at the level of the lower zone.

* * * * *